United States Patent
Chapelon

(10) Patent No.: US 9,136,233 B2
(45) Date of Patent: Sep. 15, 2015

(54) PROCESS FOR FABRICATING A THREE-DIMENSIONAL INTEGRATED STRUCTURE WITH IMPROVED HEAT DISSIPATION, AND CORRESPONDING THREE-DIMENSIONAL INTEGRATED STRUCTURE

(71) Applicant: STMicroelectronics (Crolles 2) SAS, Crolles (FR)

(72) Inventor: Laurent-Luc Chapelon, Domene (FR)

(73) Assignee: STMicroelctronis (Crolles 2) SAS, Crolles (FR)

( * ) Notice: Subject to any disclaimer, the term of this patent is extended or adjusted under 35 U.S.C. 154(b) by 0 days.

(21) Appl. No.: 14/293,341

(22) Filed: Jun. 2, 2014

(65) Prior Publication Data

US 2014/0361413 A1    Dec. 11, 2014

(30) Foreign Application Priority Data

Jun. 6, 2013 (FR) ..................... 13 55215

(51) Int. Cl.
*H01L 29/06* (2006.01)
*H01L 21/30* (2006.01)

(Continued)

(52) U.S. Cl.
CPC ............... *H01L 24/06* (2013.01); *H01L 23/13* (2013.01); *H01L 23/3128* (2013.01); *H01L 23/4275* (2013.01); *H01L 23/49816* (2013.01); *H01L 24/03* (2013.01); *H01L 25/0657* (2013.01); *H01L 25/50* (2013.01); *H01L 29/0657* (2013.01); *H01L 2224/16225* (2013.01); *H01L 2224/32145* (2013.01);

(Continued)

(58) Field of Classification Search
CPC ........... H01L 2924/01079; H01L 2924/01078; H01L 21/76254; H01L 21/2007; H01L 21/76808; H01L 21/76807; H01L 21/7683; H01L 21/76891; H01L 21/76804; H01L 21/31116; H01L 21/76843; H01L 21/76877; H01L 23/10
USPC ......... 257/618, 622, 626, 629, 632, 678, 684, 257/687, 701, 707; 438/106, 107, 118, 455, 438/456, 638–640, 654
See application file for complete search history.

(56) References Cited

U.S. PATENT DOCUMENTS 6,114,221 A    9/2000 Tonti et al.
6,495,396 B1 *  12/2002 Drost ........................... 438/107

(Continued)

FOREIGN PATENT DOCUMENTS

EP     1703557 A2    9/2006
WO   WO-2004059720 A1    7/2004

OTHER PUBLICATIONS

INPI Search Report and Written Opinion for FR 1355215 mailed Oct. 16, 2013 (7 pages).

*Primary Examiner* — Hsien Ming Lee
(74) *Attorney, Agent, or Firm* — Gardere Wynne Sewell LLP

(57) ABSTRACT

A three-dimensional integrated structure includes a first integrated circuit having a substrate assembled in an interlocking manner with a second integrated circuit having a substrate. The substrate of the first integrated circuit comprises first pores separated by first partitions, and the substrate of the second integrated circuit comprises second pores separated by second partitions. The first partitions interlock with the second pores and the second partitions interlock with the first pores so as to define at least one region bounded by the two substrates. A phase-change material is retained within the at least one region.

19 Claims, 5 Drawing Sheets

(51) Int. Cl.
  *H01L 23/00*  (2006.01)
  *H01L 23/427*  (2006.01)
  *H01L 25/065*  (2006.01)
  *H01L 25/00*  (2006.01)
  *H01L 23/13*  (2006.01)
  *H01L 23/31*  (2006.01)
  *H01L 23/498*  (2006.01)

(52) U.S. Cl.
  CPC ............... *H01L 2224/48227* (2013.01); *H01L 2224/73265* (2013.01); *H01L 2225/0651* (2013.01); *H01L 2225/06517* (2013.01); *H01L 2225/06555* (2013.01); *H01L 2225/06558* (2013.01); *H01L 2225/06589* (2013.01); *H01L 2225/06593* (2013.01); *H01L 2924/10155* (2013.01); *H01L 2924/15311* (2013.01)

(56) References Cited

U.S. PATENT DOCUMENTS

| | | |
|---|---|---|
| 2007/0267738 A1 | 11/2007 | Chung et al. |
| 2011/0085670 A1* | 4/2011 | Pang et al. ............ 381/22 |
| 2012/0217610 A1 | 8/2012 | Hopper et al. |

* cited by examiner

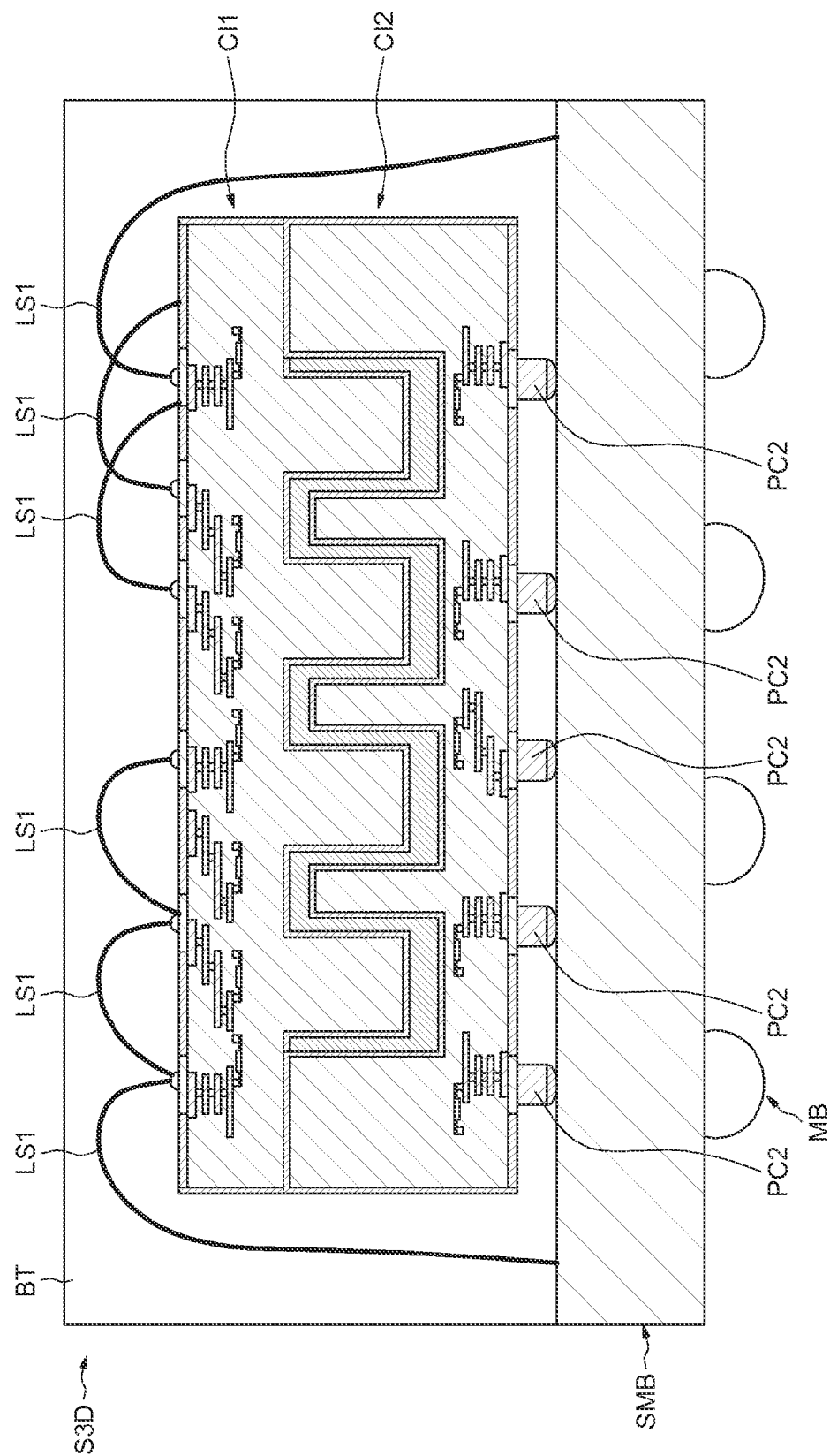

PROCESS FOR FABRICATING A THREE-DIMENSIONAL INTEGRATED STRUCTURE WITH IMPROVED HEAT DISSIPATION, AND CORRESPONDING THREE-DIMENSIONAL INTEGRATED STRUCTURE

PRIORITY CLAIM

This application claims priority from French Application for Patent No. 1355215 filed Jun. 6, 2013, the disclosure of which is incorporated by reference.

TECHNICAL FIELD

The invention relates to integrated circuits, especially to three-dimensional integrated structures, and more particularly to the dissipation of heat inside such structures.

BACKGROUND

Three-dimensional integrated structures generally comprise at least two integrated circuits fabricated independently then connected together. During the operation of these integrated circuits, the various components of the integrated circuits generate heat, and it is for example possible to obtain rises in temperature of up to 174° C. inside integrated circuits used to form memory circuits. This heat limits the operating power of integrated circuits and therefore their performance. This limitation is particularly critical in certain applications, such as mobile telephony applications for example.

Increased heat dissipation per unit area is observed in these structures. This is because heat intensity and heat flow are not uniform inside these structures, and many thermal obstacles, such as, for example, materials having a low thermal conductivity and/or the integrated circuits themselves, limit heat dissipation inside the structure.

SUMMARY

According to one method of implementation and embodiment, a process for fabricating a three-dimensional integrated structure, and a three-dimensional integrated structure with improved heat dissipation are provided.

According to one aspect, a process is provided for fabricating a three-dimensional integrated structure, comprising assembling the substrate of a first integrated circuit with the substrate of a second integrated circuit.

According to a general characteristic, the process comprises, prior to the assembly step, forming first pores separated by first partitions in the substrate of the first integrated circuit, forming second pores separated by second partitions in the substrate of the second integrated circuit, at least partially filling the second pores with a phase-change material, the first partitions being intended to be interlocked in the second pores and the second partitions being intended to be interlocked in the first pores so as to form at least one region bounded by said two substrates and containing phase-change material.

The phase-change material, here thermal, which fills the pores and then said region, can store thermal energy by changing phase during the operation of the two integrated circuits. This energy is then released in the form of heat when the two integrated circuits are no longer in operation. The heat dissipation of the obtained structure is thus improved, and it is possible to obtain a drop in the operating temperature relative to structures not comprising a region containing a phase-change material.

Furthermore, by forming a set of pores separated by partitions that are interlocked with each other, the area of heat exchange inside the structure with the phase-change material is increased.

It should be noted that it is advantageous to implement the process for back-to-back assembly of the integrated circuits. Specifically, according to one method of implementation, it is possible to form the first pores in the back side of the first integrated circuit and it is possible to form the second pores in the back side of the second integrated circuit, thereby leading to assembly of the back side of the first integrated circuit with the back side of the second integrated circuit.

It is possible to form a continuous region, to further increase this heat exchange area inside the structure.

The assembly may comprise bonding the peripheral part of a side intended for assembly of the first integrated circuit to the peripheral part of a side intended for assembly of the second integrated circuit, each partition being spaced apart from the pore with which it is interlocked. In other words, the walls of the pores and of the partitions of an integrated circuit make contact only with the phase-change material and never with the walls of the pores or of the partitions of the other integrated circuit.

Thus, a continuous region is obtained that extends between the pores and the partitions, except at the periphery of the integrated circuits where the two integrated circuits are bonded.

The substrate of the first integrated circuit may comprise silicon and the substrate of the second integrated circuit may comprise silicon, said process comprising, prior to the filling step and subsequent to the steps of forming the pores and the partitions, forming silicon dioxide on the internal walls of the pores, on the internal walls of the partitions, and on the substrate parts intended for assembly.

Specifically, two portions of silicon dioxide may easily be bonded together, for example on the peripheral part of the integrated circuits.

According to another aspect, a three-dimensional integrated structure is provided, comprising a first integrated circuit having a substrate assembled with a second integrated circuit having a substrate.

The first substrate comprises first pores separated by first partitions, and the second substrate comprises second pores separated by second partitions, the first partitions being interlocked with the second pores and the second partitions being interlocked with the first pores so as to create at least one region bounded by the two substrates and containing a phase-change material.

Said region may be continuous.

The peripheral part of an assembled side of the first integrated circuit may be bonded to the peripheral part of an assembled side of the second integrated circuit, each partition being spaced apart from the pore with which it is interlocked.

The substrate of the first integrated circuit may comprise silicon and the substrate of the second integrated circuit may comprise silicon, the internal walls of the pores, the internal walls of the partitions, and the assembled substrate parts comprising silicon dioxide.

The first pores may be arranged in the back side of the first integrated circuit and the second pores may be arranged in the back side of the second integrated circuit.

BRIEF DESCRIPTION OF THE DRAWINGS

Other advantages and features of the invention will become apparent on examining the detailed non-limiting description of methods of implementation and embodiment, and the appended drawings in which:

FIGS. 1 to 5 illustrate various steps of methods of implementation and various embodiments of an integrated structure according to the invention.

DETAILED DESCRIPTION OF THE DRAWINGS

Figure 1:
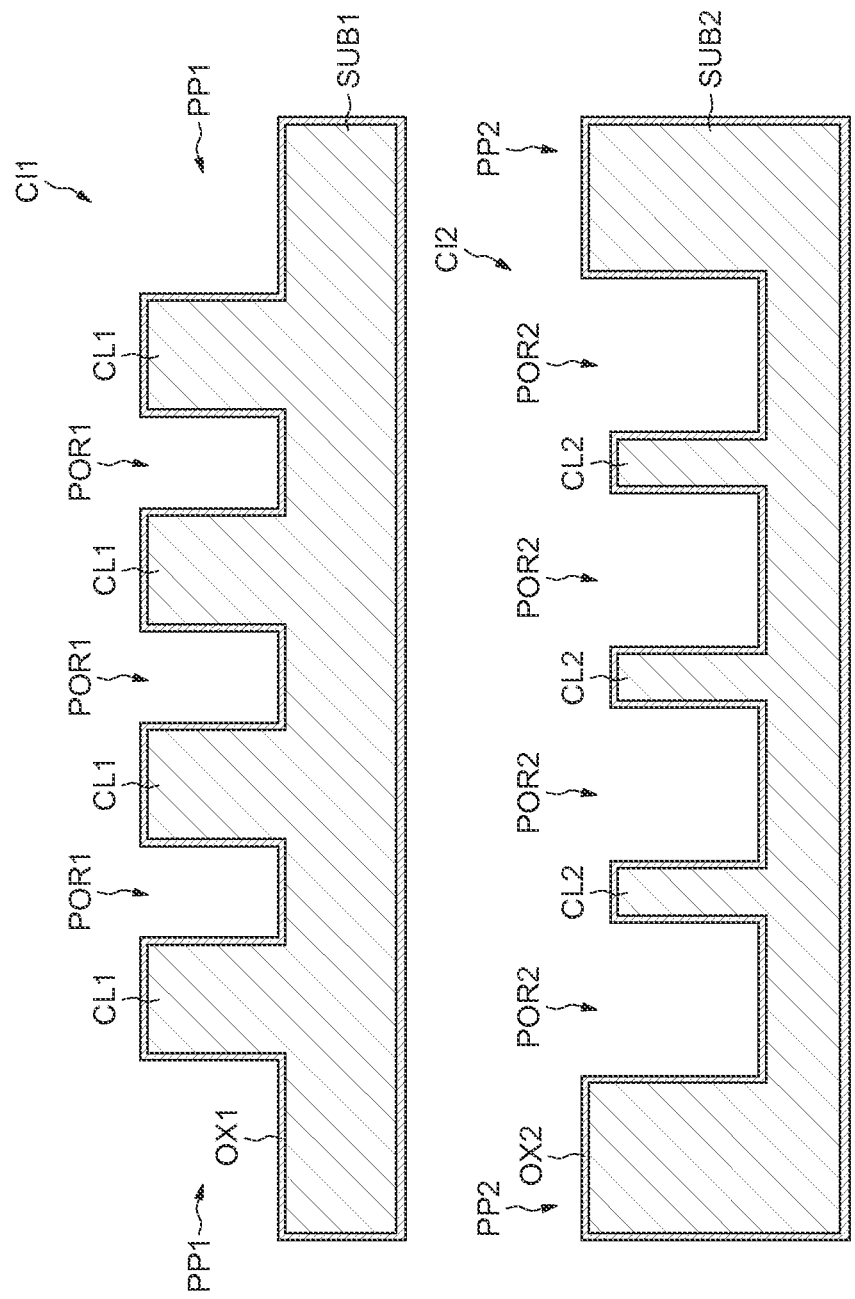

FIG. 1 shows a first integrated circuit CI1 and a second integrated circuit CI2 that will be assembled by forming a region comprising a phase-change material to improve heat dissipation inside the three-dimensional integrated structure obtained.

The first integrated circuit comprises a substrate SUB1, made of silicon for example, and the second integrated circuit also comprises a substrate SUB2, also made of silicon for example. These substrates may have been thinned beforehand, the first substrate SUB1 may, for example, have a thickness of about 400 μm and the second substrate SUB2 may have a thickness of about 450 μm. This thinning may be carried out by conventional steps of chemical-mechanical planarization and etching.

On one side of the first integrated circuit CI1 a set of first pores POR1 has been formed, with, for example, a depth of about 350 μm and a width of 150 μm, and which are spaced apart by partitions CL1 that are 300 μm wide. The first integrated circuit CI1 also comprises a peripheral part PP1 the bottom of which is intended to be bonded. The peripheral part PP1 of the first integrated circuit CI1 may, for example, extend over a distance of 550 μm and be arranged at the same level as the bottom of the pores POR1.

Furthermore, on the first integrated circuit CI1, a layer of silicon dioxide OX1 has been formed on the walls of the pores POR1, on the walls of the partitions CL1, in the peripheral parts PP1 and around the substrate SUB1.

On one side of the second integrated circuit CI2, a set of second pores POR2 has been formed, with, for example, a depth of about 350 μm and a width of about 400 μm. The pores POR2 are spaced apart by partitions CL2 that are 50 μm wide and 350 μm high. The second integrated circuit CI2 also comprises a peripheral part PP2 intended to be bonded to the peripheral part PP1 of the first integrated circuit. This peripheral part PP2 of the second integrated circuit may extend over a distance of 500 μm, and its height relative to the bottom of the pores of the second integrated circuit CI2 may be 400 μm. The second integrated circuit may also comprise a layer of silicon dioxide OX2.

Forming the pores POR2 may comprise two steps, namely a first step of forming pores having a depth of 400 μm, and a second step of etching the partitions separating these pores to obtain 350 μm-high partitions, while retaining peripheral parts that are 400 μm high relative to the bottom of the pores POR2.

To form the pores POR1 and POR2 it is also possible to implement a process comprising an initial step of priming the pores, in which a silicon nitride mask and potassium hydroxide (KOH) are used, and a step of photo-anodic dissolution of the silicon by means of hydrofluoric acid (HF). Those skilled in the art will know how to parameterize these steps to obtain pores of the dimensions and geometries mentioned above.

Figure 2:
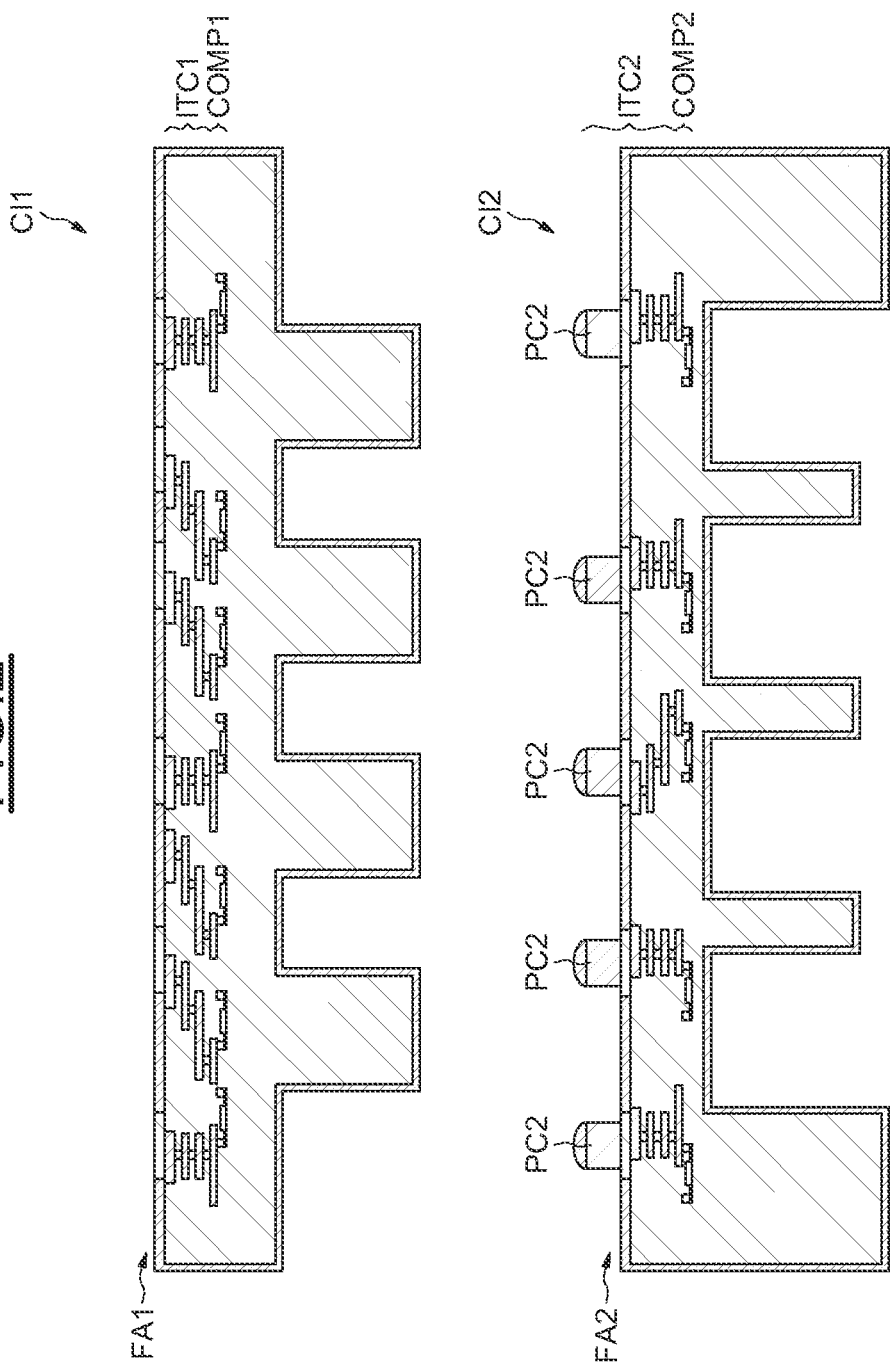

FIG. 2 shows the integrated circuits CI1 and CI2 after a step of forming components, for example transistors, to form the FEOL (Front End Of Line) part well known to those skilled in the art.

More precisely, on a front side FA1 of the first integrated circuit CI1, opposite the side containing the pores POR1 and the partitions CL1, a part comprising components COMP1 is formed, surmounted by an interconnect part ITC1 known to those skilled in the art as BEOL (Back End Of Line) part.

On a front side FA2 of the second integrated circuit CI2, opposite the side comprising the pores POR2 and the partitions CL2, a part comprising components COMP2 is formed, surmounted by an interconnect part ITC2 that notably comprises conductive pillars PC2 intended to enable connection of the second integrated circuit, for example to a support.

As a variant, it is possible to produce these parts comprising components COMP1 and COMP2 and these interconnect parts ITC1 and ITC2 before producing the pores.

Figure 3:
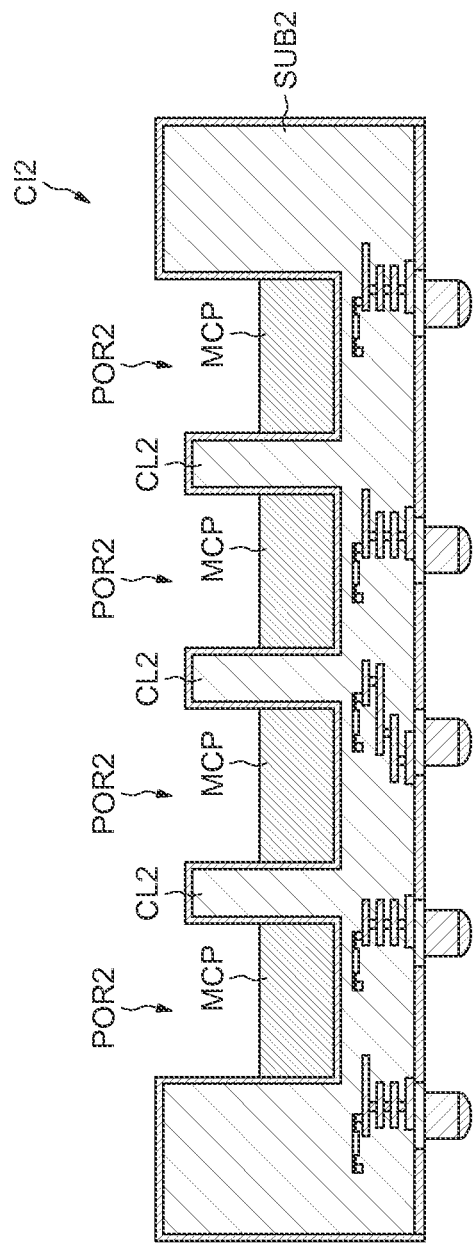

FIG. 3 shows the second integrated circuit CI2 after a step of partial filling of the pores POR2 with a phase-change material MCP. For example, the pores POR2 may be filled up to a height of 100 μm.

A phase-change material may be chosen that is capable of liquefying in the temperature ranges corresponding to the operating temperatures of the integrated circuits, for example paraffin or even inorganic components such as salt hydrates.

Figure 4:
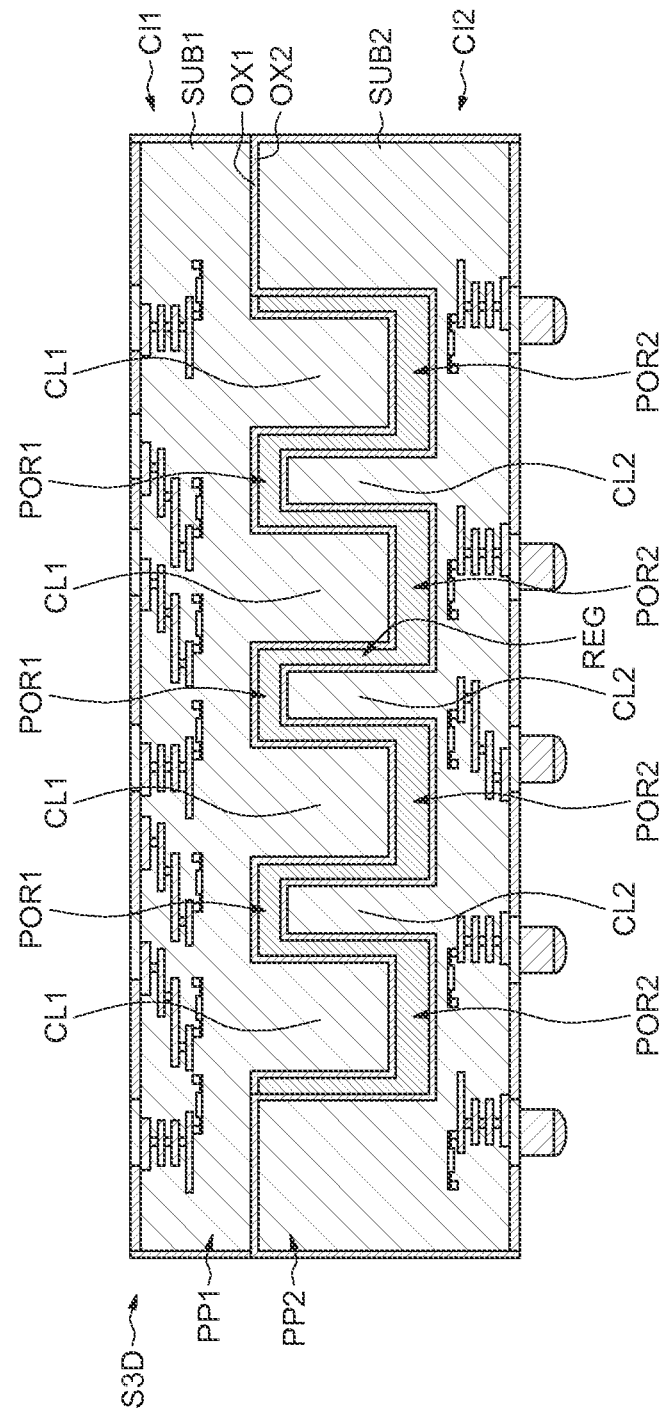

FIG. 4 shows the integrated circuits CI1 and CI2 after an assembly step in which the partitions interlock with corresponding pores. The partitions CL1 of the first integrated circuit CI1 interlock with the pores POR2 of the second integrated circuit CI2, and the partitions CL2 of the second integrated circuit CI2 interlock with the pores of the first integrated circuit CI1.

The assembly may be obtained by bonding, for example direct bonding, the peripheral parts PP1 and PP2 of the first and of the second integrated circuit, and in particular by bonding together the layers of silicon dioxide OX1 and OX2 of these peripheral parts.

A region REG containing the phase-change material is obtained, which region extends continuously between the walls of the pores and of the partitions. It should be noted that the dimensions proposed above for the pores and the partitions make it possible to obtain a continuous region REG. In particular, after assembly, there is no contact between the walls of the partitions and of the pores, which are still spaced apart, for example by 50 μm here, with the exception of the peripheral parts that are bonded together.

The step of filling the pores with a phase-change material, described with reference to FIG. 3, may be implemented so as to obtain a region REG that also comprises an empty space, having a height, for example, of about 40 μm, in order to allow the phase-change material contained in the region REG to spread in the event of a temperature increase.

Generally, the integrated circuits CI1 and CI2 are produced on silicon wafers, and at this stage the wafers are cut along scribe lines to singulate the three-dimensional structures comprising the integrated circuits CI1 and CI2.

Thus a three-dimensional integrated structure S3D is obtained, which comprises a first integrated circuit CI1 having a substrate SUB1 assembled with a second integrated circuit CI2 having a substrate SUB2. The first substrate SUB1 comprises first pores POR1 separated by first partitions CL1, the second substrate SUB2 comprises second pores POR2 separated by second partitions CL2, the first partitions CL1 being interlocked with the second pores POR2, and the second partitions CL2 being interlocked with the first pores POR1 so as to create at least one region REG bounded by the two substrates and containing a phase-change material.

The three-dimensional integrated structure S3D obtained may then be assembled on a support SMB, as illustrated in FIG. 5. In this figure, the three-dimensional integrated structure S3D is shown mounted in a package BT equipped with the support SMB formed with a ball grid array MB for forming electrical contacts with a view to connection to a printed circuit board, for example. The conductive pillars PC2 make electrical contact with a support SMB of the ball grid array MB. Furthermore, the integrated circuit CI1 makes electrical contact with the support SMB by means of connections LS1 such as wire bonding.

According to one aspect of the invention, a three-dimensional integrated structure is obtained in which heat dissipation is improved. Thus, temperature peaks during operation of the circuits are reduced relative to a structure that does not comprise a region containing a phase-change material.

Furthermore, by forming an interlocking structure, the heat exchange area is considerably increased and a better improvement in heat dissipation is obtained.

What is claimed is:

1. A process for fabricating a three-dimensional integrated structure, comprising:
    forming first pores separated by first partitions in a substrate of a first integrated circuit;
    forming second pores separated by second partitions in a substrate of a second integrated circuit;
    wherein the first partitions are configured to interlock with the second pores and the second partitions are configured to interlock with the first pores;
    at least partially filling the second pores with a phase-change material configured for liquefying in the temperature ranges corresponding to the operating temperature of the first and second integrated circuits;
    assembling the substrate of the first integrated circuit with the substrate of the second integrated circuit so as to form at least one region bounded by said two substrates, defined by the interlock and retaining said phase-change material.

2. The process according to claim 1, in which a continuous region is formed.

3. The process according to claim 1, in which assembling comprises bonding a peripheral part of a side of the first integrated circuit to a peripheral part of a side intended of the second integrated circuit.

4. The process according to claim 1, in which each partition is spaced apart from each pore with which it is interlocked.

5. The process according to claim 1, in which the substrate of the first integrated circuit comprises silicon and the substrate of the second integrated circuit comprises silicon, said process comprising, prior to filling and subsequent to forming the pores and the partitions, forming a silicon dioxide layer on internal walls of the first and second pores, on internal walls of the partitions, and on peripheral parts.

6. The process according to claim 1, in which the first pores are formed in a back side of the first integrated circuit, and in which the second pores are formed in a back side of the second integrated circuit.

7. The process of claim 1, wherein assembling the substrate of the first integrated circuit with the substrate of the second integrated circuit further comprising liquefying the phase change material to fill the at least one region bounded by said two substrates.

8. The process of claim 1, wherein assembling the substrate of the first integrated circuit with the substrate of the second integrated circuit further comprising bonding peripheral parts of the first and the second integrated circuits with layers of silicon dioxide.

9. The process of claim 1, wherein the phase change material comprises paraffin or salt hydrates.

10. A three-dimensional integrated structure, comprising:
    a first integrated circuit having a substrate, the substrate of the first integrated circuit comprising first pores separated by first partitions;
    a second integrated circuit having a substrate, the substrate of the second integrated circuit comprising second pores separated by second partitions;
    wherein the first partitions are configured to interlock with the second pores and the second partitions are configured to interlock with the first pores;
    wherein the first and second integrated circuits are assembled with the interlock to provide at least one region bounded by the two substrates; and
    a phase-change material contained within said at least one region, wherein the phase change material is configured for liquefying in the temperature ranges corresponding to the operating temperatures of the first and the second integrated circuits.

11. The structure according to claim 10, in which said region is continuous.

12. The structure according to claim 10, in which a peripheral part of the first integrated circuit is bonded to a peripheral part of the second integrated circuit.

13. The structure according to claim 10, wherein each partition is spaced apart from each pore with which it is interlocked.

14. The structure according to claim 10, in which the substrate of the first integrated circuit comprises silicon and the substrate of the second integrated circuit comprises silicon, and in which internal walls of the first and second pores and internal walls of the partitions a covered by a silicon dioxide layer.

15. The structure according to claim 10, in which the first pores are arranged in a back side of the first integrated circuit and the second pores are arranged in a back side of the second integrated circuit.

16. The three-dimensional integrated structure of claim 10, wherein the substrate of the first integrated circuit and the substrate of the second integrated circuit are bonded at peripheral parts with layers of silicon dioxide.

17. A three-dimensional integrated structure, comprising:
    a first integrated circuit having a first substrate comprising a first set of pores and partitions, wherein the partitions arise from the substrate to bound the pores;
    a second integrated circuit having a second substrate comprising a second set of pores and partitions, wherein the second set of pores receives the first set of partitions and the second set of partitions are received by the first set of pores;
    wherein the first substrate mates with the second substrate at peripheral parts and allows the first and second sets of pores and partitions form a continuous region; and
    a phase change material filling the continuous region, the phase change material configured for liquefying in the temperature ranges corresponding to the operating temperatures of the first and the second integrated circuits.

18. The three-dimensional integrated structure of claim 17, wherein the first substrate bonds to the second substrate at the peripheral parts with layers of silicon dioxide.

19. The three-dimensional integrated structure of claim 17, wherein the phase change material comprises paraffin or salt hydrates.

\* \* \* \* \*